United States Patent
Ahmad et al.

(10) Patent No.: US 6,839,290 B2
(45) Date of Patent: Jan. 4, 2005

(54) METHOD, APPARATUS, AND SYSTEM FOR HIGH SPEED DATA TRANSFER USING SOURCE SYNCHRONOUS DATA STROBE

(75) Inventors: Abid Ahmad, Folsom, CA (US); Katen Shah, Orangevale, CA (US); Alankar Saxena, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/663,235

(22) Filed: Sep. 15, 2003

(65) Prior Publication Data

US 2004/0052129 A1 Mar. 18, 2004

Related U.S. Application Data

(63) Continuation of application No. 09/541,140, filed on Mar. 31, 2000, now Pat. No. 6,621,760.
(60) Provisional application No. 60/175,835, filed on Jan. 13, 2000.

(51) Int. Cl.[7] .................................................. G11C 7/00
(52) U.S. Cl. ........................ 365/193; 365/194; 365/233
(58) Field of Search ................................. 365/193, 194, 365/233, 189.08, 189.05

(56) References Cited

U.S. PATENT DOCUMENTS

| | | | |
|---|---|---|---|
| 4,780,891 A | * | 10/1988 | Guerin et al. ............... 375/362 |
| 5,109,304 A | * | 4/1992 | Pederson ..................... 360/51 |
| 6,128,248 A | | 10/2000 | Idei et al. |
| 6,275,086 B1 | | 8/2001 | Douchi et al. |
| 6,374,360 B1 | | 4/2002 | Keeth et al. |
| 6,397,312 B1 | | 5/2002 | Nakano et al. |
| 2002/0091958 A1 | | 7/2002 | Schoenfeld et al. |

* cited by examiner

*Primary Examiner*—Thong Q. Le
(74) *Attorney, Agent, or Firm*—Blakely, Sokoloff, Taylor & Zafman LLP

(57) ABSTRACT

According to one aspect of the invention, a method is provided in which a write strobe signal is generated to latch output data into a memory unit that comprises one or more dual data rate synchronous dynamic random access memory (DDR-SDRAM) devices. The write strobe signal has an edge transition at approximately the center of a data window corresponding to the output data. A first receive clock signal is delayed by a first delay period using a delay locked loop (DLL) circuit to generate a first delayed receive clock signal. The first delayed receive clock signal is used to latch incoming data from the memory unit.

30 Claims, 6 Drawing Sheets

METHOD, APPARATUS, AND SYSTEM FOR HIGH SPEED DATA TRANSFER USING SOURCE SYNCHRONOUS DATA STROBE

RELATED APPLICATIONS

This application is a Continuation of application Ser. No. 09/541,140, filed Mar. 31, 2000, which issued to U.S. Pat. No. 6,621,760 B1 on Sep. 16, 2003.

This application claims the benefit of U.S. Provisional Application No. 60/175,835, filed Jan. 13, 2000.

FIELD OF THE INVENTION

The present invention relates generally to the field of data transfer technology. More specifically, the present invention relates to a method, apparatus, and system for high speed data transfer using source synchronous data strobe.

BACKGROUND OF THE INVENTION

Currently, graphics controllers/accelerators such as the Intel 740 supports local memory interface from 66.67 MHz to 100 MHz. A typical graphics controller such as the Intel 740 has its own local memory that can be SDRAM or Dual Data Rate SDRAM. DDR SDRAM specifies data transfers at 2× the maximum transfer rate. For a 100 MHz DDR SDRAM, control would be transferred at 1× speed (e.g., once every 100 MHz clock) whereas data would be transferred at 2× speed (twice every 100 MHz clock). As DRAM vendors move their silicon to next generation processes (e.g., less than or equal to 0.25 microseconds), the capability to produce higher frequency SDRAM parts will increase up to a maximum of 150 MHz at the system level. The loading on control signals is higher than that on data lines which restricts going beyond 150 MHz. DDR takes advantage of the lighter data load and increases the data transfer rate. As a result, graphics controllers/accelerators need to be able to accommodate high speed data transfer at higher frequencies than 100 MHz.

SUMMARY OF THE INVENTION

According to one aspect of the invention, a method is provided in which a write strobe signal is generated to latch output data into a memory unit that comprises one or more dual data rate synchronous dynamic random access memory (DDR-SDRAM) devices. The write strobe signal has an edge transition at approximately the center of a data window corresponding to the output data. A first receive clock signal is delayed by a first delay period using a delay locked loop (DLL) circuit to generate a first delayed receive clock signal. The first delayed receive clock signal is used to latch incoming data from the memory unit.

BRIEF DESCRIPTION OF THE DRAWINGS

The features and advantages of the present invention will be more fully understood by reference to the accompanying drawings, in which.

DETAILED DESCRIPTION

In the following detailed description numerous specific details are set forth in order to provide a thorough understanding of the present invention. However, it will be appreciated by one skilled in the art that the present invention may be practiced without these specific details.

The present invention provides a method, apparatus, and a system that allows high speed data transfer at higher frequencies than 100 MHz. The high speed data transfer can be achieved by using a centered write strobed data latching and delay locked loop (DLL) based strobeless read data latching. It is assumed that DDR SDRAM specifications will include the following improvements: differential clocking; differential input buffers; additional strobe input; improved input loading; and SSTL electricals (if required). In one embodiment, a write strobe signal is generated to latch output data transmitted from a transmitting agent (e.g., a memory interface unit of a graphics accelerator) into a memory unit (e.g., a local memory unit coupled to the graphics accelerator). The memory unit, in one embodiment, includes one or more dual data rate synchronous dynamic random access memory (DDR-SDRAM) devices. The write strobe signal is aligned with respect to the data window corresponding to the output data so that the edge transition of the write strobe signal occurs at about the center of the data window. In one embodiment, a first receive signal is delayed by a first delay period using a delay locked loop (DLL) circuit to generate a first delayed receive clock signal. The first delayed receive clock signal is used to latch incoming data from the memory unit. In one embodiment, the first delayed receive clock signal is used to clock a latching device to latch incoming data from the memory unit. The incoming data is latched in response to the edge transition of the first delayed receive clock signal. In one embodiment, the first delayed receive clock signal is aligned with respect to the data window corresponding to the incoming data so that the edge transition of the first delayed receive clock signal occurs at such a point to provide sufficient setup time and hold time for the latching device to timely latch the incoming data from the memory unit. In one embodiment, the DLL circuit is programmable using a register. The first delay period is adjustable using a value stored in the register. The teachings of the present invention are applicable to any memory interface or memory controller that is used to control the data transfer between a graphics accelerator/controller and a corresponding local memory unit. However, the teachings of the present invention are not limited to the memory interfaces between graphics controllers and their corresponding local memory units and can also be applied to any other scheme, method, apparatus, or system for high speed data transfer between a host device and a memory device.

Figure 1:
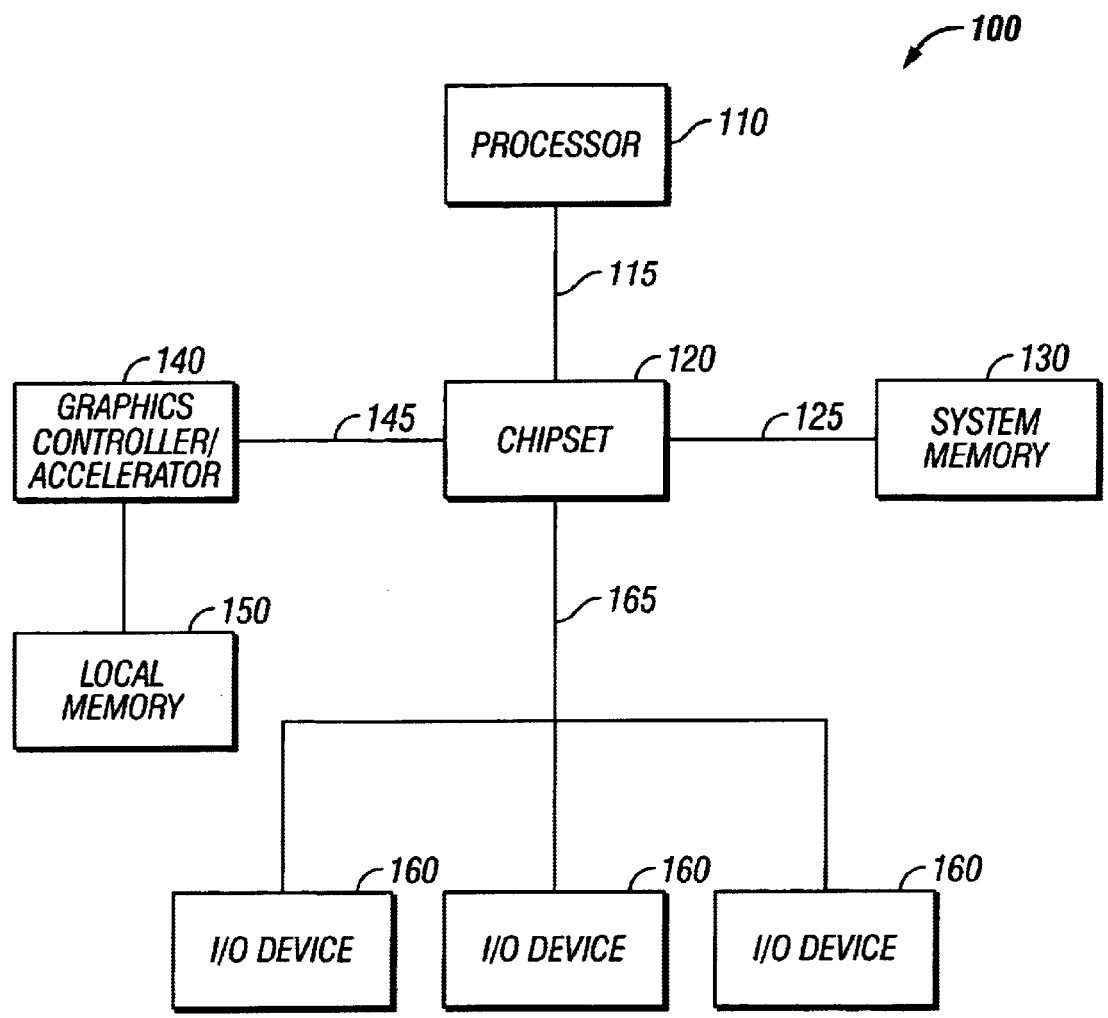
FIG. 1 shows a block diagram of one embodiment of a system according to the teachings of the present invention.

FIG. 1 shows a block diagram of one embodiment of a system 100 according to the teachings of the present invention. The system 100 as shown in FIG. 1 includes one or more processors 110, a chipset unit 120, a system memory unit 130, a graphics controller/accelerator unit 140, a local memory unit 150, and various I/O devices 160. For the purposes of the present specification, the term "processor" or "CPU" refers to any machine that is capable of executing a sequence of instructions and shall be taken to include, but not be limited to, general purpose microprocessors, special purpose microprocessors, multi-media controllers and microcontrollers, etc. In one embodiment, the processors 110 are general-purpose microprocessors that are capable of executing an Intel Architecture instruction set. The chipset unit 120 is coupled to the processor 110 via a host bus 115 and coupled to the memory unit 130 via a memory bus 125. The graphics controller/accelerator 140 is coupled to the chipset unit 120 via an AGP bus 145. In one embodiment, the chipset unit 120 may be an Intel chipset. In one embodiment, the graphics controller/accelerator 140 may be an Intel graphics accelerator. The teachings of the present invention, however, are not limited to Intel products and/or architecture and are applicable to any other products and/or architecture. In one embodiment, the chipset unit 120 includes a memory control unit (not shown) that controls the interface between various system components and the system memory unit 130. The various I/O units 160, in one embodiment, are coupled to the chipset unit 120 via an I/O bus or PCI bus 165.

Figure 2:
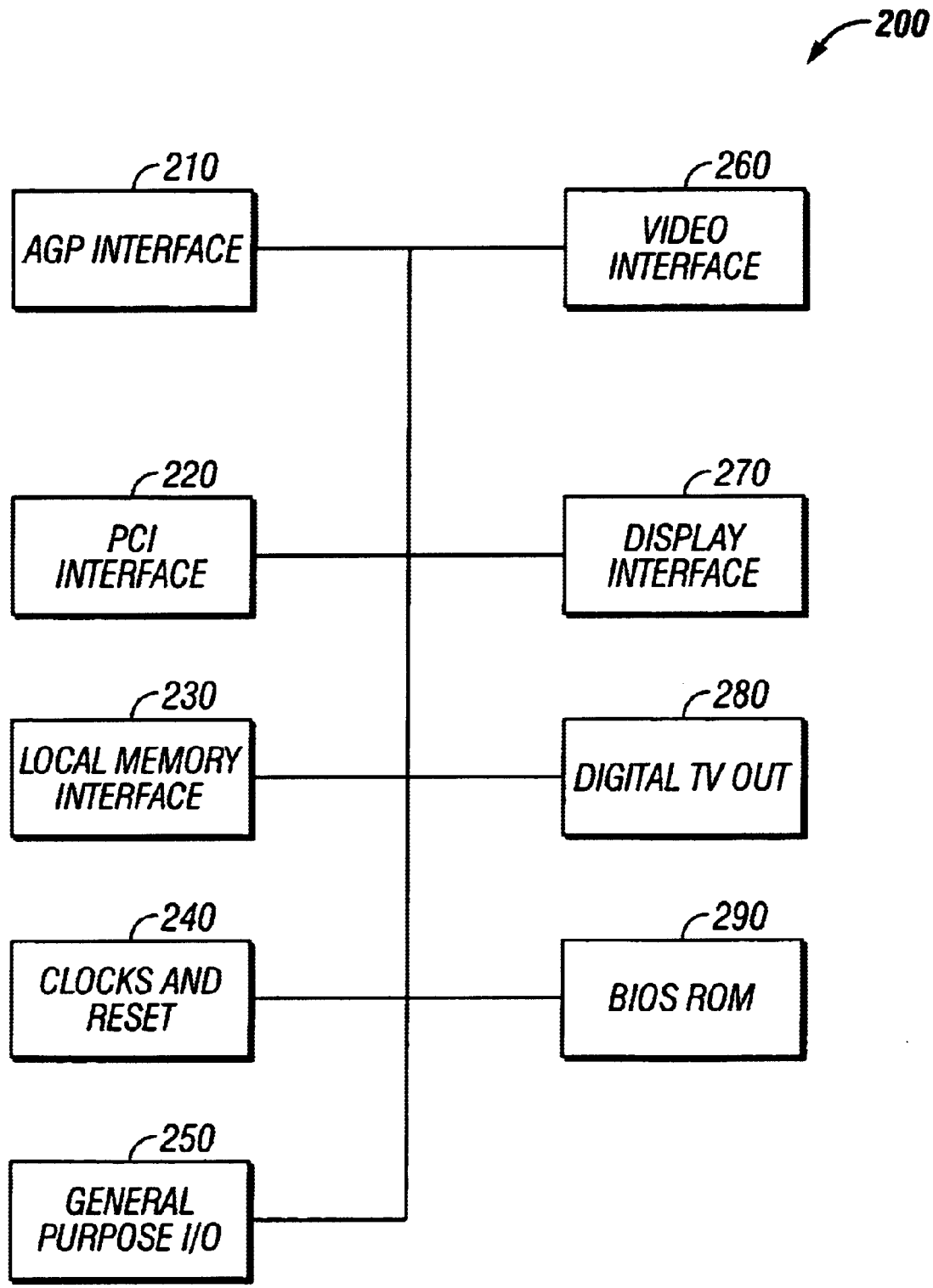
FIG. 2 shows a block diagram of one embodiment of a graphics controller/accelerator.

FIG. 2 shows a block diagram of one embodiment 200 of the graphics controller/accelerator 140 described in FIG. 1. The graphics controller 140, in one embodiment, includes an AGP interface 210, a PCI interface 220, a local memory interface 230, a clocks and reset unit 240, a general purpose I/O unit 250, a video interface 260, a display interface 270, a digital TV Out unit 280, and a BIOS ROM 290. The structure and operation of the local memory interface unit 230 are described in more detail below. In one embodiment, the local memory interface 230 controls the interface (e.g., data transfer) between the graphics accelerator 140 and the local memory unit 150.

Figure 3:
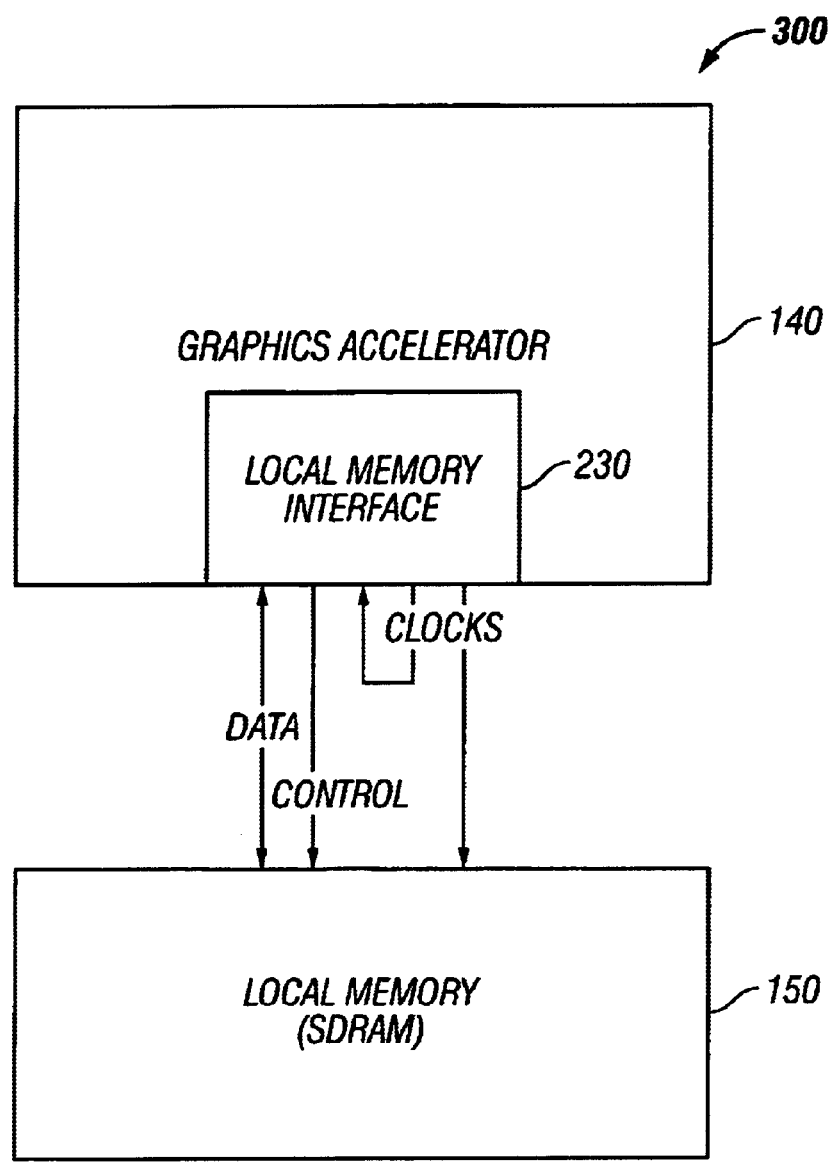
FIG. 3 is a block diagram of one embodiment of a local memory interface unit according to the teachings of the present invention.

FIG. 3 shows various signal interfaces between the local memory interface unit 230 and the local memory 150. As shown in FIG. 3, the local memory interface unit 230 sends data, control, and clock signals to the local memory unit 150 (e.g., SDRAM). The local memory interface unit 230 also receives data from the local memory 150. In one embodiment, the control and clock signals are used by the local memory interface unit 230 to facilitate and control the data transfer between the local memory interface unit 230 and the local memory 150.

Figure 4:
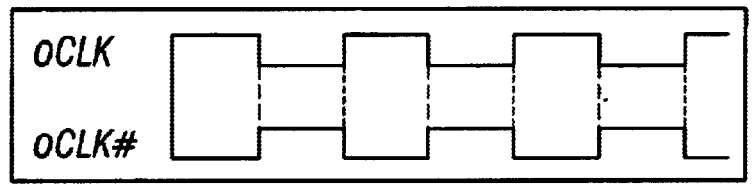
FIG. 4 shows a differential clocking diagram.

FIG. 4 shows a differential clocking diagram of two clock signals oCLK and oCLK# generated by the graphics accelerator 140 to facilitate data transfer between the graphics accelerator 140 and the local memory 150. In one embodiment, the graphics accelerator 140 generates two copies of the same clock phase shifted by half a clock. This effectively provides 2× clocking as shown in FIG. 4.

Figure 5:
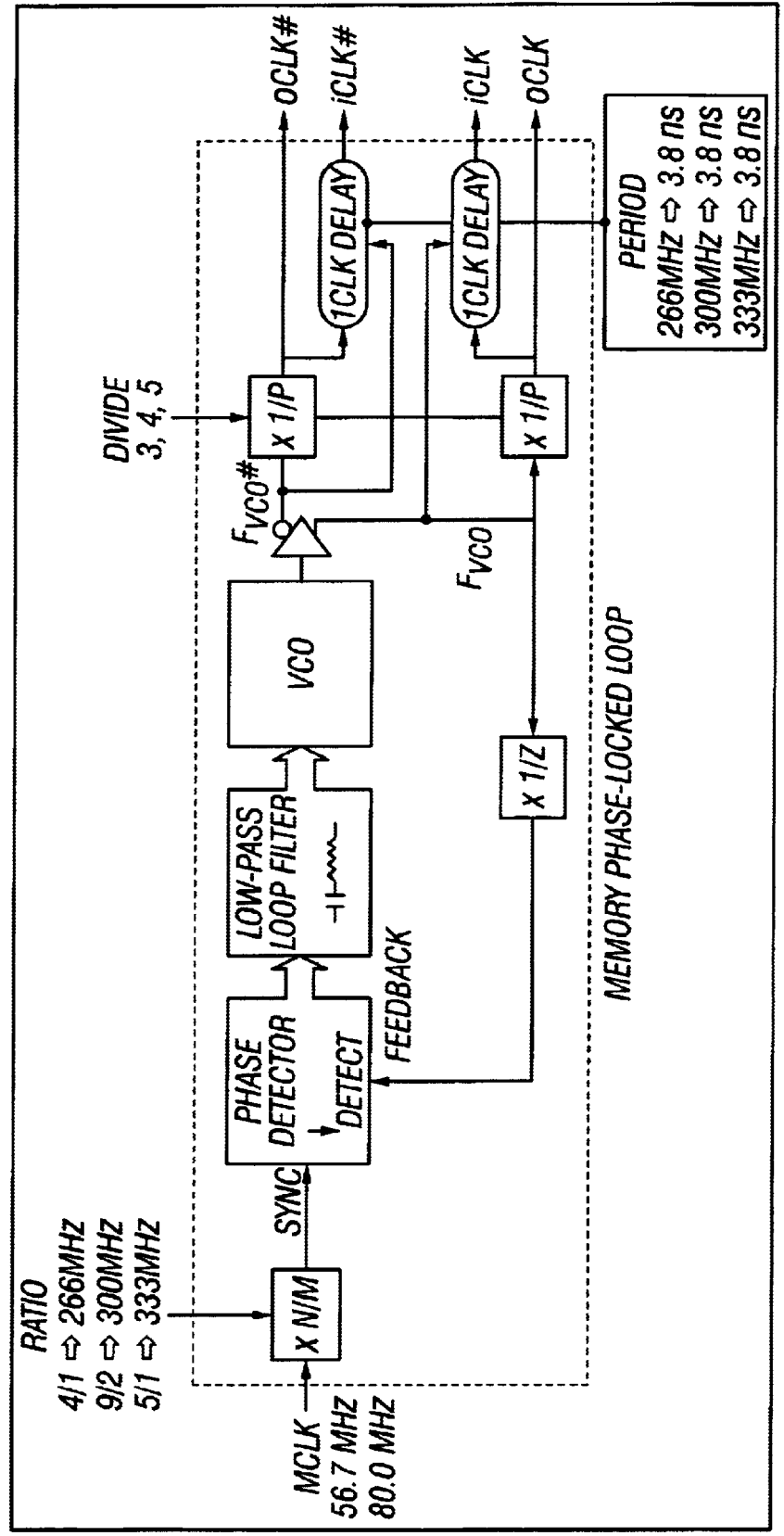
FIG. 5 shows a block diagram of one embodiment of a memory PLL circuit according to the teachings of the present invention.

FIG. 5 shows a block diagram of one embodiment of a phase locked loop (PLL) circuit 500 for generating two pairs of clock signals oCLK and iCLK that are used to facilitate data transfer between the graphics accelerator 140 and the local memory 150. In one embodiment, the PLL circuit 500 as shown in FIG. 5 is contained within the local memory interface unit 230. In another embodiment, the PLL circuit 500 may be a stand alone unit or contained within another unit in the graphics accelerator 140. In one embodiment, the oCLK/oCLK# pair is used for external DQ I/O and control clocking and iCLK/iCLK# pair is used internally for clocking the write strobe (also referred to as Write QS herein). In one embodiment, the iCLK is oCLK plus a delay equal to the period of the FVCO of the PLL. This allows for adding a fixed PLL delay to the iCLK. This fixed delay is relatively insensitive to changes in process, temperature and voltage. FIG. 5 shows the various fixed PLL delays at corresponding frequencies. At 100 MHz, N/M is 9/2 and 1/P is 1/3 which gives a PLL delay of 3.3 ns.

Figure 6:
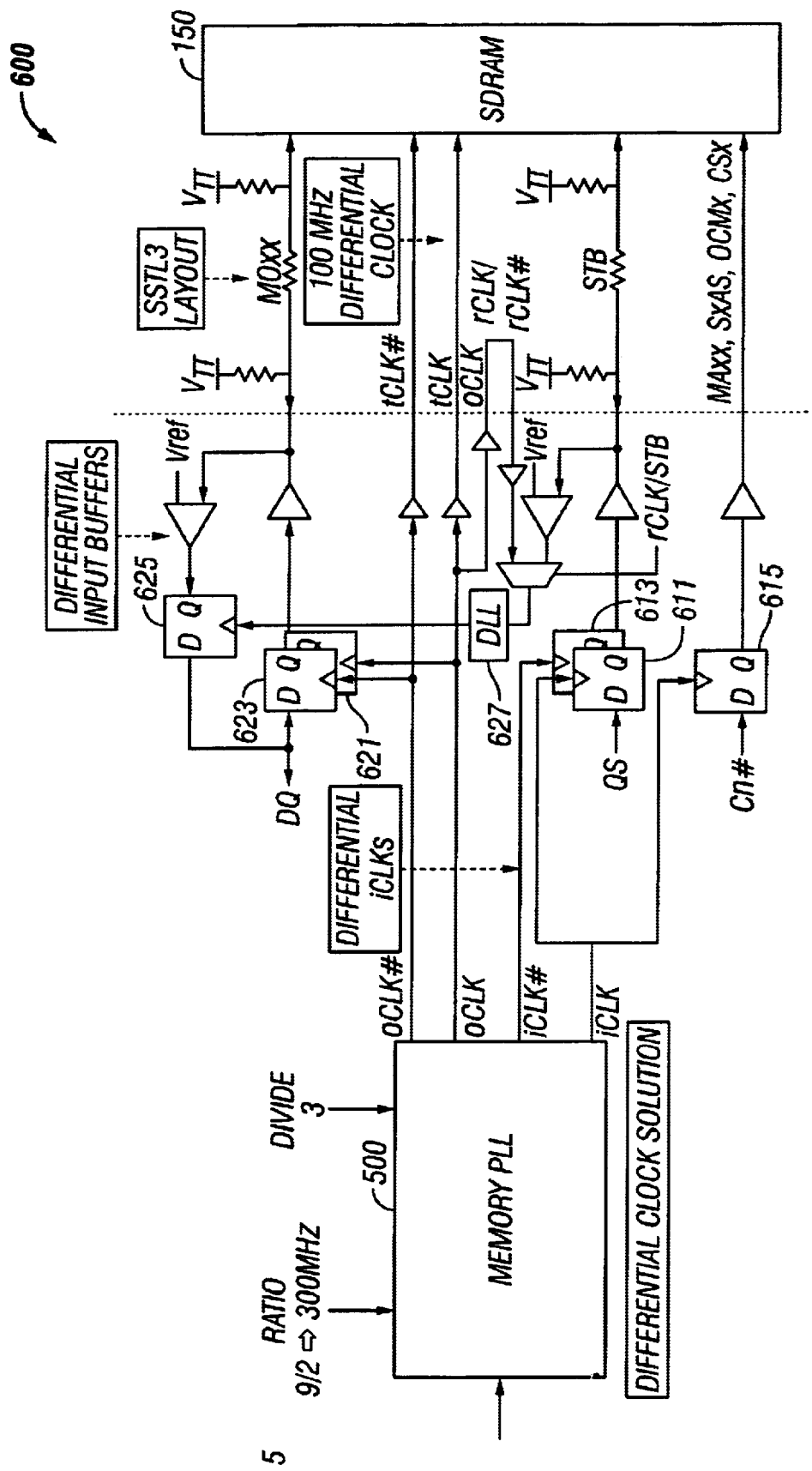
FIG. 6 illustrates a block diagram of a local memory I/O structure showing the various interface signals between the local memory interface unit and the local memory.

FIG. 6 shows a block diagram of one embodiment of a local memory I/O structure to facilitate data transfer between the graphics accelerator 140 and the local memory 150 (e.g., SDRAM). As shown in FIG. 6, the Memory PLL 500 receives the MCLK clock input (at either 66.7 MHz or 60.0 MHz), a ratio input of 9/2 and a divide input of 3 and generates two pairs of clock signals: oCLK and oCLK#, iCLK and iCLK#. As shown in FIG. 6, the oCLK signal is used to generate the tCLK (transmit clock) and the rCLK (receive clock). The tCLK is sent to the local memory 150 (e.g., the SDRAM) and the rCLK clock is used to latch the incoming data (data reads) from the local memory 150. The rCLK is input to a DLL circuit 627 that generates a clock signal to latch input data coming from the local memory 150. In this embodiment, the DLL 627 is a programmable DLL which receives the rCLK as its input and generates the output signal which is used to clock a latching device 625 to latch data coming from the local memory (data reads). The oCLK# signal is used to generate the tCLK# signal which is sent to the local memory 150 (e.g., SDRAM). The oCLK and oCLK# signals are used to clock latching devices 621 and 623, respectively. The iCLK and iCLK# are used to clock latching devices 611 and 613, respectively. As shown in FIG. 6, the iCLK signal is used to clock the latching device 611 to send the write data strobe signal QS to the local memory 150 for data writes. The iCLK signal is also used to clock a latching device 615 to send control signals to the local memory 150. The present invention thus provides a mechanism for high speed data transfer (more than 100 MHz) between the local memory 150 which uses DDR SDRAM and the graphics controller/accelerator 140 by using source synchronous data strobe for writes (i.e., the write data strobe or QS signal shown in FIG. 6) and programmable DLL for reads (i.e., DLL based strobeless read data latching).

Figure 7:
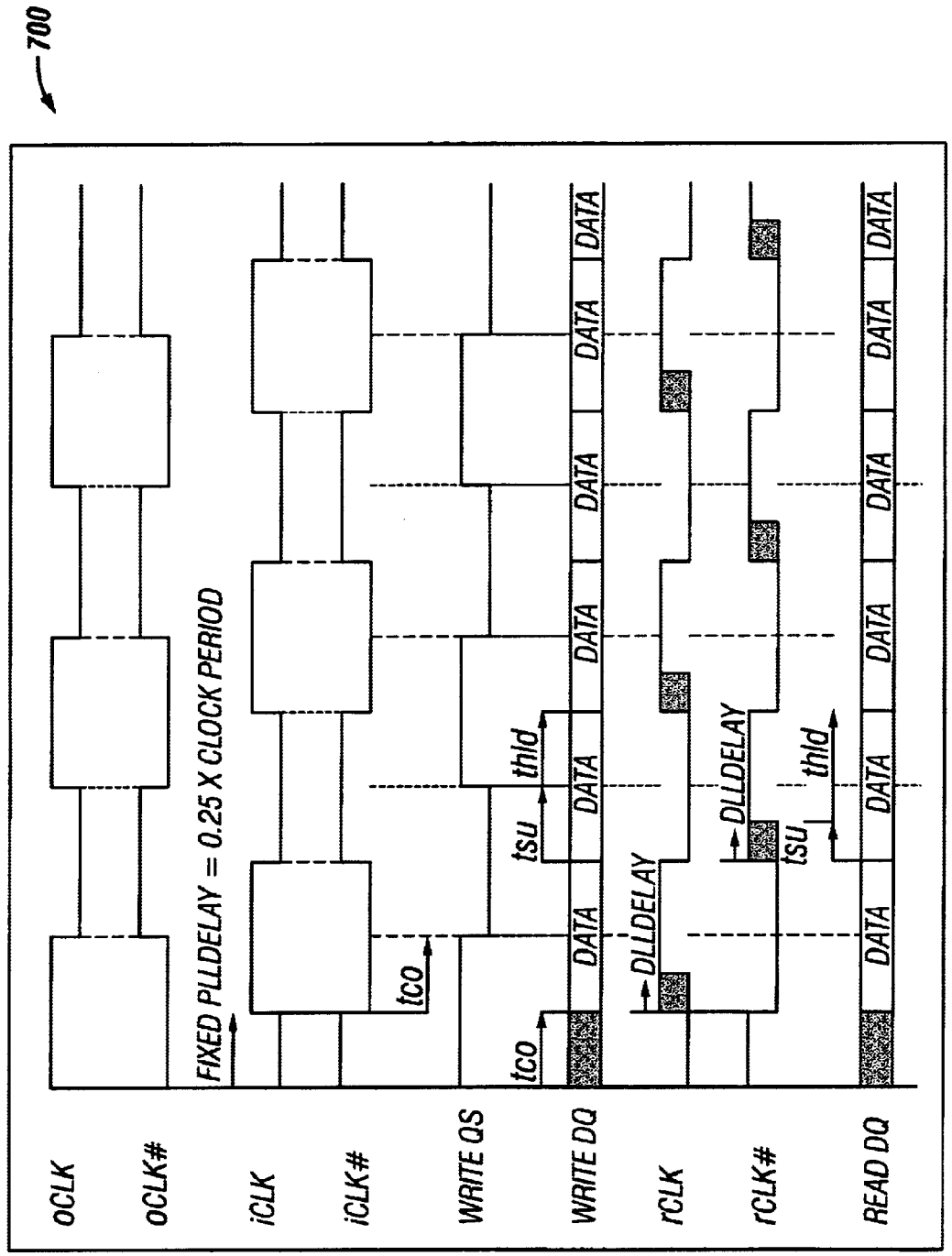
FIG. 7 shows an example of a timing diagram showing various interface signals in FIG. 6.

FIG. 7 shows a diagram illustrating the timing of the various signals described in FIGS. 5 and 6 above. As shown in FIG. 7, the oCLK and oCLK# signals are two copies of the same clock phase shifted by half a clock. The iCLK is oCLK plus a delay equal to period of the Fvco of the PLL. The iCLK# is shifted from the iCLK by half a clock. The Write QS signal is used to trigger data writes to the local memory 150. The rCLK and rCLK# signals are used to trigger data reads from the local memory 150 using a DLL delay as shown in FIG. 6.

The invention has been described in conjunction with the preferred embodiment. It is evident that numerous alternatives, modifications, variations and uses will be apparent to those skilled in the art in light of the foregoing description.

What is claimed is:

1. An apparatus comprising:
   first logic to generate a write strobe signal that is used to latch output data into a memory unit, the write strobe signal having an edge transition at approximately the center of a data window corresponding to the output data;
   second logic to delay a first receive clock signal by a first delay period to generate a first delayed receive clock signal, the first delayed receive clock signal being used to latch incoming data from the memory unit; and
   third logic to align the edge transition of the write strobe signal and the data window.

2. The apparatus of claim 1 wherein the memory unit comprises one or more DDR-SDRAM devices.

3. The apparatus of claim 1 wherein the second logic delays the first receive clock signal using a delay locked loop (DLL) circuit.

4. The apparatus of claim 1 wherein the third logic aligns the edge transition of the write strobe signal and the data window corresponding to the output data such that the edge transition of the write strobe signal approximately corresponds to the center of the data window.

5. The apparatus of claim 4 wherein the third logic comprises:
   first and second latching devices to latch the output data in response to transitions of a first and a second clock signal, respectively, the first and second clock signals being phase shifted by one half of a clock period corresponding to the frequency of the first and second clock signals; and
   third and fourth latching devices to latch the write strobe signal in response to transitions of a third and a fourth clock signal, respectively, the third and fourth clock signals being phase shifted by one half of the clock period.

6. The apparatus of claim 5 wherein the first, second, third, and fourth clock signals are derived from a system clock signal using a phase locked loop (PLL) circuit.

7. The apparatus of claim 3 wherein the DLL circuit is programmable via a register.

8. The apparatus of claim 7 wherein the first delay period corresponds to a value stored in the register.

9. The apparatus of claim 1 further comprising fourth logic to delay a second receive clock signal by the first delay period.

10. The apparatus of claim 9 wherein the fourth logic delays the second receive clock signal by the first delay period by using a DLL circuit to generate a second delayed receive clock signal, the second delayed receive clock signal being used to latch incoming data from the memory unit.

11. A method comprising:
   generating a write strobe signal that is used to latch output data into a memory unit, the write strobe signal having an edge transition at approximately the center of a data window corresponding to the output data;
   delaying a first receive clock signal by a first delay period to generate a first delayed receive clock signal, the first delayed receive clock signal being used to latch incoming data from the memory unit; and
   aligning the edge transition of the write strobe signal and the data window.

12. The method of claim 11 wherein the memory unit comprises one or more DDR-SDRAM devices.

13. The method of claim 11 wherein the first receive clock signal is delayed using a delay locked loop (DLL) circuit.

14. The method of claim 11 wherein the edge transition of the write strobe signal and the data window are aligned corresponding to the output data such that the edge transition of the write strobe signal approximately corresponds to the center of the data window.

15. The method of claim 14 wherein aligning the edge transition of the write strobe signal and the data window further comprises:
   latching the output data in response to transitions of a first and a second clock signal, respectively, the first and second clock signals being phase shifted by one half of a clock period corresponding to the frequency of the first and second clock signals; and
   latching the write strobe signal in response to transitions of a third and a fourth clock signal, respectively, the third and fourth clock signals being phase shifted by one half of the clock period.

16. The method of claim 15 wherein the first, second, third, and fourth clock signals are derived from a system clock signal using a phase locked loop (PLL) circuit.

17. The method of claim 13 wherein the DLL circuit is programmable via a register.

18. The method of claim 17 wherein the first delay period corresponds to a value stored in the register.

19. The method of claim 11 further comprising delaying a second receive clock signal by the first delay period.

20. The method of claim 19 wherein the second receive clock signal is delayed by the first delay period by using a DLL circuit to generate a second delayed receive clock signal, the second delayed receive clock signal being used to latch incoming data from the memory unit.

21. A system comprising:
   a memory unit; and
   a graphics accelerator coupled to the memory unit including a memory interface to control data transfer between the graphics accelerator and the memory unit, the memory interface comprising:
      first logic to generate a write strobe signal that is used to latch output data into a memory unit, the write strobe signal having an edge transition at approximately the center of a data window corresponding to the output data;
      second logic to delay a first receive clock signal by a first delay period to generate a first delayed receive clock signal, the first delayed receive clock signal being used to latch incoming data from the memory unit; and
      third logic to align the edge transition of the write strobe signal and the data window.

22. The system of claim 21 wherein the memory unit comprises one or more DDR-SDRAM devices.

23. The system of claim 21 wherein the second logic delays the first receive clock signal using a delay locked loop (DLL) circuit.

24. The system of claim 21 wherein the third logic aligns the edge transition of the write strobe signal and the data window corresponding to the output data such that the edge transition of the write strobe signal approximately corresponds to the center of the data window.

25. The system of claim 24 wherein the third logic comprises:
   first and second latching devices to latch the output data in response to transitions of a first and a second clock signal, respectively, the first and second clock signals being phase shifted by one half of a clock period corresponding to the frequency of the first and second clock signals; and
   third and fourth latching devices to latch the write strobe signal in response to transitions of a third and a fourth clock signal, respectively, the third and fourth clock signals being phase shifted by one half of the clock period.

26. The system of claim 25 wherein the first, second, third, and fourth clock signals are derived from a system clock signal using a phase locked loop (PLL) circuit.

27. The system of claim 23 wherein the DLL circuit is programmable via a register.

28. The system of claim 27 wherein the first delay period corresponds to a value stored in the register.

29. The system of claim 21 further comprising fourth logic to delay a second receive clock signal by the first delay period.

30. The system of claim 29 wherein the fourth logic delays the second receive clock signal by the first delay period by using a DLL circuit to generate a second delayed receive clock signal, the second delayed receive clock signal being used to latch incoming data from the memory unit.

* * * * *